United States Patent [19]
Iseki et al.

[11] Patent Number: 6,074,515
[45] Date of Patent: Jun. 13, 2000

[54] APPARATUS FOR PROCESSING SUBSTRATES

[75] Inventors: Izuru Iseki; Seiichiro Sato; Yusuke Muraoka, all of Shiga, Japan

[73] Assignee: Dainippon Screen Mfg. Co., Ltd., Japan

[21] Appl. No.: 09/044,812

[22] Filed: Mar. 20, 1998

[30] Foreign Application Priority Data

Mar. 24, 1997 [JP] Japan .................................. 9-069666

[51] Int. Cl.⁷ .............................. C23F 1/02; B08B 13/00; B65G 49/07; B05C 11/00; B05C 3/02
[52] U.S. Cl. .......................... 156/345; 414/331; 414/404; 414/416; 414/744.1; 414/936; 414/937; 414/938; 414/940; 414/941; 134/25.1; 134/25.4; 134/61; 134/76; 134/143; 134/902; 118/73; 118/423
[58] Field of Search ................... 134/2, 3, 25.1, 134/25.4, 61, 76, 82, 143, 902; 414/331, 404, 416, 419, 744.1, 744.2, 744.3, 744.4, 744.5, 744.6, 744.7, 744.8, 935, 936, 937, 938, 940, 941; 118/73, 400, 412, 423

[56] References Cited

U.S. PATENT DOCUMENTS

| | | | |
|---|---|---|---|
| 4,744,815 | 5/1988 | Kawabata .............................. | 414/331 |
| 5,180,273 | 1/1993 | Sakaya et al. .......................... | 414/404 |
| 5,240,557 | 8/1993 | Dyer et al. ............................. | 156/654 |
| 5,324,155 | 6/1994 | Goodwin et al. ....................... | 414/225 |
| 5,356,261 | 10/1994 | Nishi ................................... | 414/744.7 |
| 5,374,153 | 12/1994 | Nishi ..................................... | 414/417 |
| 5,387,265 | 2/1995 | Kakizaki et al. ...................... | 29/25.01 |
| 5,464,313 | 11/1995 | Ohsawa ................................. | 414/172 |
| 5,590,672 | 1/1997 | Ohmori et al. ........................ | 134/201 |
| 5,668,452 | 9/1997 | Villarreal et al. .................. | 318/568.16 |
| 5,810,538 | 9/1998 | Ozawa et al. ......................... | 414/217 |
| 5,862,826 | 1/1999 | Kamikawa et al. ..................... | 134/182 |
| 5,947,675 | 9/1999 | Matsushima ........................... | 414/416 |
| 5,954,472 | 9/1999 | Hofmeister et al. ................. | 414/744.5 |
| 5,971,696 | 10/1999 | Endo et al. ............................ | 414/778 |
| 5,980,186 | 11/1999 | Cheng ................................... | 414/416 |

*Primary Examiner*—Richard Bueker
*Assistant Examiner*—Jeffrie R Lund
*Attorney, Agent, or Firm*—Ostrolenk, Faber, Gerb & Soffen, LLP

[57] ABSTRACT

In a substrate processing apparatus receiving substrates held in a common carrier in a horizontal attitude, the substrates are transferred in the horizontal attitude from the common carrier to an exclusive carrier. The exclusive carrier is rotatable on a horizontal axis. By rotating the exclusive carrier, the substrates are turned from the horizontal attitude to a vertical attitude. Then, the substrates held in the vertical attitude are taken out of the exclusive carrier and transferred to a processing part for processing in the vertical attitude. This allows a simple and speedy turn of the plurality of substrates. Further, even the apparatus for processing the substrates in a vertical attitude can transfer the substrates into and out of the apparatus in the horizontal attitude by using the common carrier.

20 Claims, 14 Drawing Sheets

A—A

APPARATUS FOR PROCESSING SUBSTRATES

BACKGROUND OF THE INVENTION

FIELD OF THE INVENTION

The present invention relates to a substrate processing apparatus for applying a predetermined process to semiconductor substrates (hereinafter, referred to as substrates) held in a vertical attitude, a substrate transfer apparatus for the purpose of handling the substrates in a vertical attitude, or the like.

BACKGROUND OF THE INVENTION

In many of conventional substrate processing apparatuses for applying a predetermined process to substrates, a carrier holding a plurality of substrates is used to transfer the substrates into and out of the apparatuses. The substrates in a carrier are held in a vertical attitude, not only when processed while being held in a carrier but also when being processed together after taken out of the carrier.

For example, some substrate processing apparatuses for cleaning a plurality of substrates at a time hold a plurality of substrates held in a carrier in a vertical attitude, together and dip them into processing fluid. Even if dipped together with the carrier, the substrates are processed in the vertical attitude.

In this way, substrates have been handled in a vertical attitude while held in a carrier. However, with recent upsizing of substrates due to technological innovation and for the convenience of substrate processing, a carrier used for transporting substrates between the substrate processing apparatuses has now been standardized so as to hold the substrates in a horizontal attitude.

However, the substrates held in a horizontal attitude are not always desirable at all the steps. In some steps, it may be preferable to use the substrates held in a vertical attitude.

Such a substrate processing apparatus needs to turn substrates transferred therein while held in a carrier in a horizontal attitude into a vertical attitude. Since the carrier holding those substrates is designed to transfer the substrates between the apparatuses, turning the carrier itself is inappropriate. Thus, other methods need to be considered to turn the substrates into a vertical attitude.

For example, taking out the substrates one by one with a robot hand will take an enormous time to turn all the substrates held in a carrier into a vertical attitude, which is impractical. Further, in this case, the substrates need to be held reliably, which may cause particles at an abutting part of the substrates on the robot hand.

In view of the above-described problems, the present invention provides the substrate processing apparatus which transfers substrates held in a carrier in a horizontal attitude into and out of the apparatus while processing the substrates in a vertical attitude. Such an apparatus allows a speedy and simple turn of the substrates and suppresses generation of particles. Further, in order to handle the substrates in a vertical attitude, the present invention also provides the substrate transfer apparatus for transferring the substrates held in a carrier in a horizontal attitude into another carrier to be held in a vertical attitude.

SUMMARY OF THE INVENTION

The present invention is directed to an apparatus for processing substrates. This apparatus comprises: transfer means for transferring a plurality of substrates held in a horizontal attitude from a first carrier to a second carrier; turning means for turning the second carrier to thereby turn the plurality of substrates from the horizontal attitude to a vertical attitude; processing means for processing the plurality of substrates held in the vertical attitude; and a transport system for transporting the plurality of substrates held in the vertical attitude from the turning means to the processing means.

According to the present invention, a plurality of substrates can be turned at a time in the apparatus for processing the substrates. Thus, the plurality of substrates transported into the apparatus in a horizontal attitude can be easily and speedily processed in a vertical attitude. Further, turning the substrates by one operation suppresses generation of particles due to the turn.

Further, it may be possible to turn a plurality of substrates from the vertical attitude to the horizontal attitude inside the apparatus. Also, various forms are applicable to the transport system.

Preferably, the transfer means according to the present invention comprises a plurality of holding plates each capable of holding a substrate. The plurality of holding plates slide into a backward opening part of a first carrier, to thereby move the plurality of substrates from a forward opening part of the first carrier into a forward opening part of a second carrier.

This facilitates a speedy transfer of the plurality of substrates from the first carrier to the second carrier.

The present invention is also directed to an apparatus for transferring substrates between carriers.

Further, the present invention is directed to a method for processing substrates.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
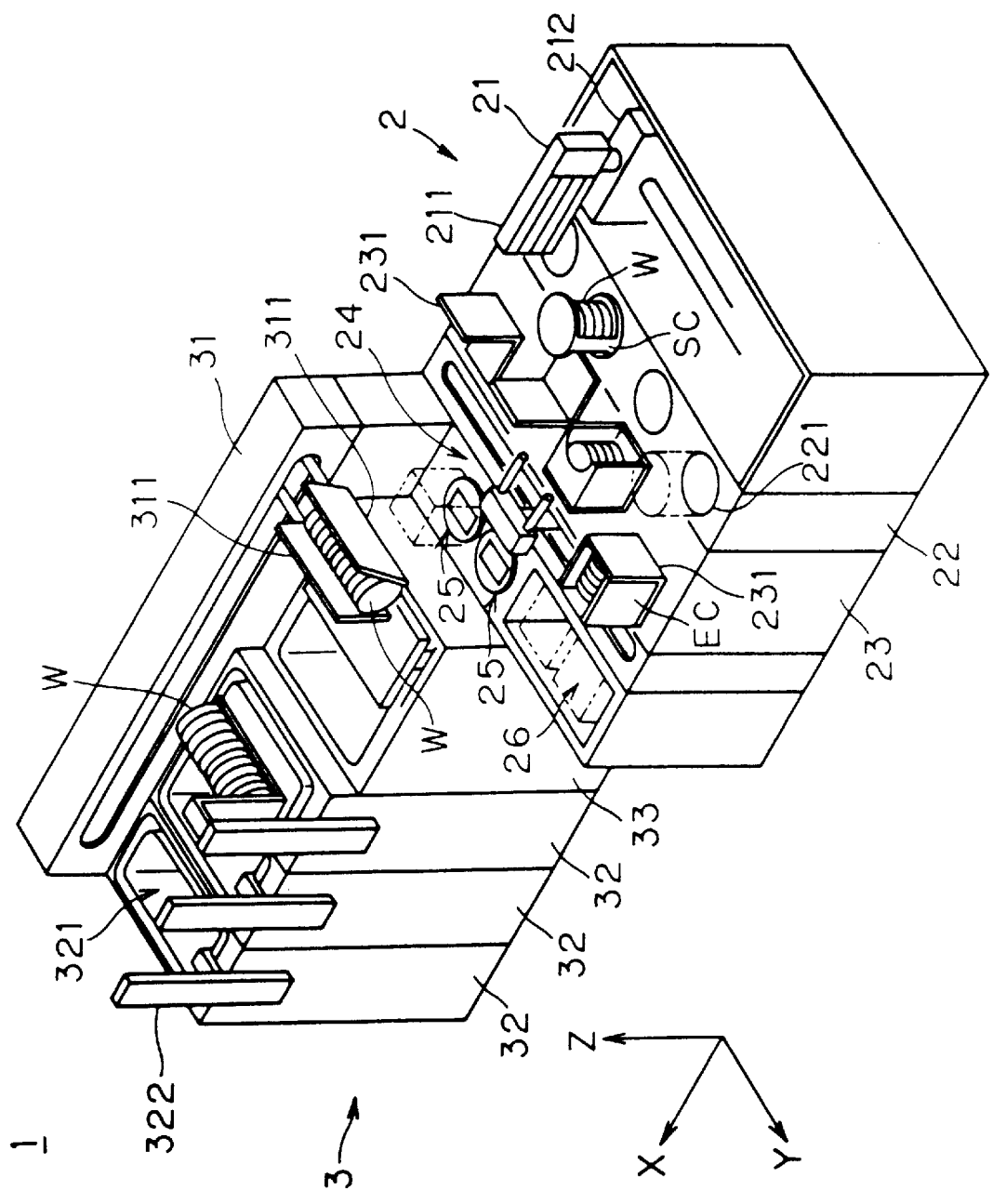
FIG. 1 is a perspective view of a substrate processing apparatus according to the present invention.
Figure 2:
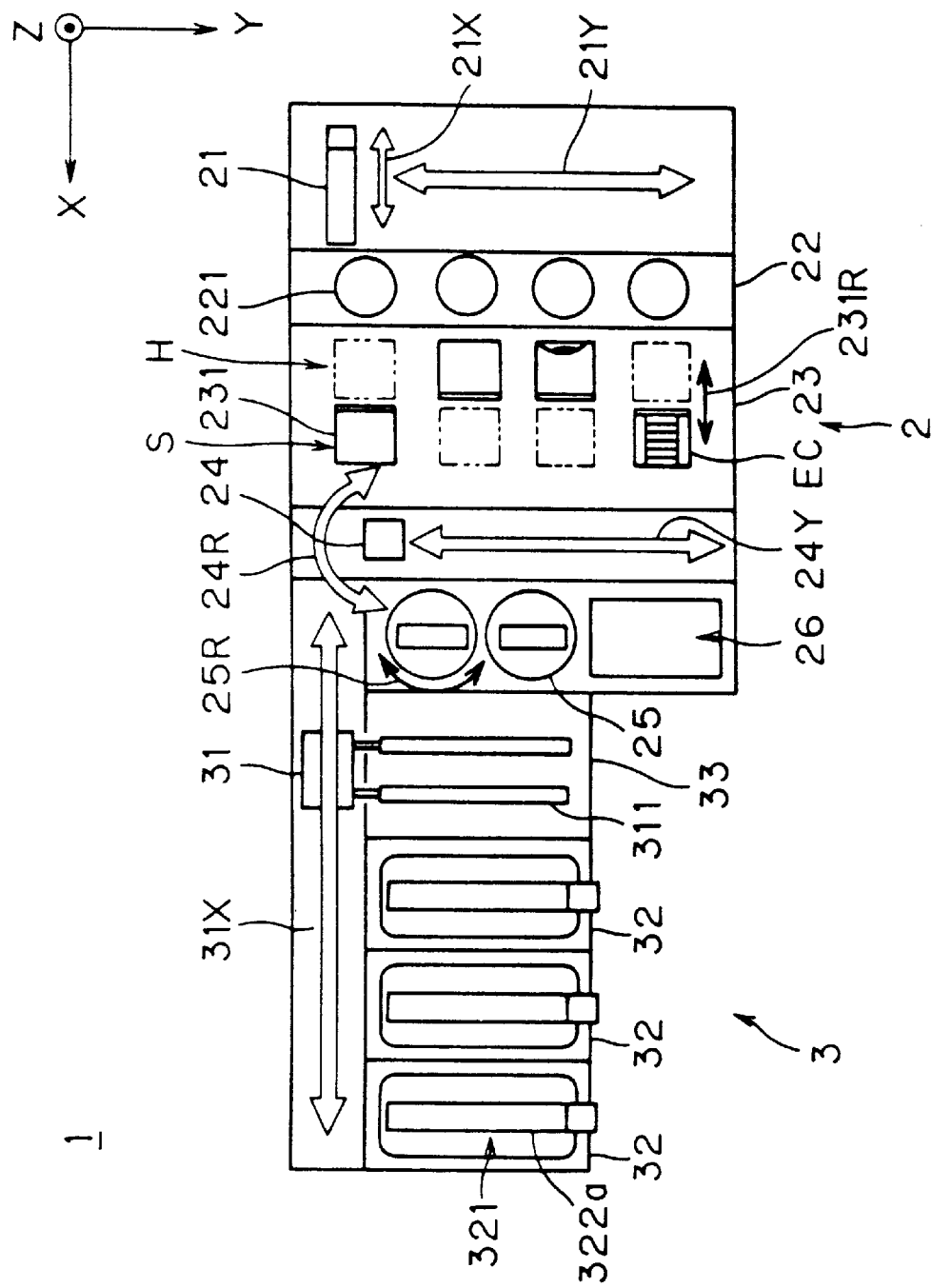
FIG. 2 is a plan view of the substrate processing apparatus in FIG. 1.

FIG. 1 is a general perspective view of a substrate processing apparatus 1 according to the present invention; and FIG. 2 is a plan view of the substrate processing apparatus 1 as viewed from above (in a negative Z direction in FIG. 1). Designed to clean substrates W held in a vertical attitude by dipping them into processing fluid such as chemical liquid or pure water, the substrate processing apparatus 1 is mainly composed of a carrier placing unit 2 and a substrate processing unit 3. The carrier placing unit 2 receives and transfers a carrier SC (used to transfer substrates between the apparatuses, and hereinafter referred to as a common carrier) from and to the outside of the apparatus, and turns the substrates W held in a horizontal attitude into a vertical attitude to transport it to the substrate processing unit 3. The substrate processing unit 3 dips the substrate W received from the carrier placing unit 2 into processing fluid for cleaning.

The carrier placing unit 2 includes a substrate transfer robot 21 for transferring the substrates W from the common carrier SC to an exclusive carrier EC used inside the apparatus 1; a common carrier placing part 22 where the common carrier SC transferred into the apparatus 1 is placed; a turning part 23 for turning the exclusive carrier EC; an exclusive carrier transport robot 24 for transporting the exclusive carrier EC; a pushing-out part 25 where the exclusive carrier EC transported by the exclusive carrier transport robot 24 is placed and the substrates W are received and transferred from and to the substrate processing unit 3; and a carrier cleaning part 26 for cleaning the exclusive carrier EC.

The substrate processing unit 3 includes a substrate transport robot 31 for transporting the substrates W transferred from the pushing-out part 25; a plurality of cleaning parts 32 for cleaning the substrates W by dipping them into processing fluid as well as receiving and transferring the substrates W from and to the substrate transfer robot 31; and a drying part 33 for drying the cleaned substrates W as well as receiving and transferring the substrates W from and to the substrate transport robot 31.

The exclusive carrier transport robot 24, the pushing-out part 25, and the substrate transport robot 31 form a transport system for transporting the substrates W between the turning part 23 and the cleaning parts 32 or the drying part 33.

The structure of the substrate processing apparatus 1 has been roughly described. Next described will be how to handle the substrates W in the substrate processing apparatus 1, and the structures and operations of the respective components.

Figure 3A:
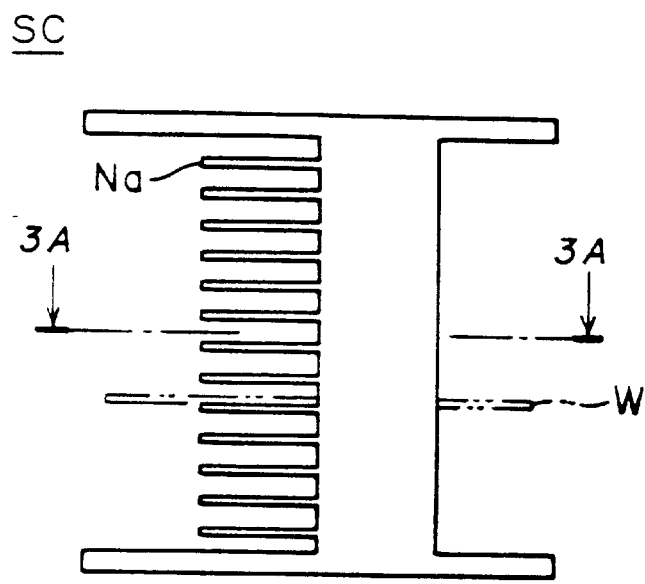
FIGS. 3A and 3B show a common carrier.
Figure 3B:
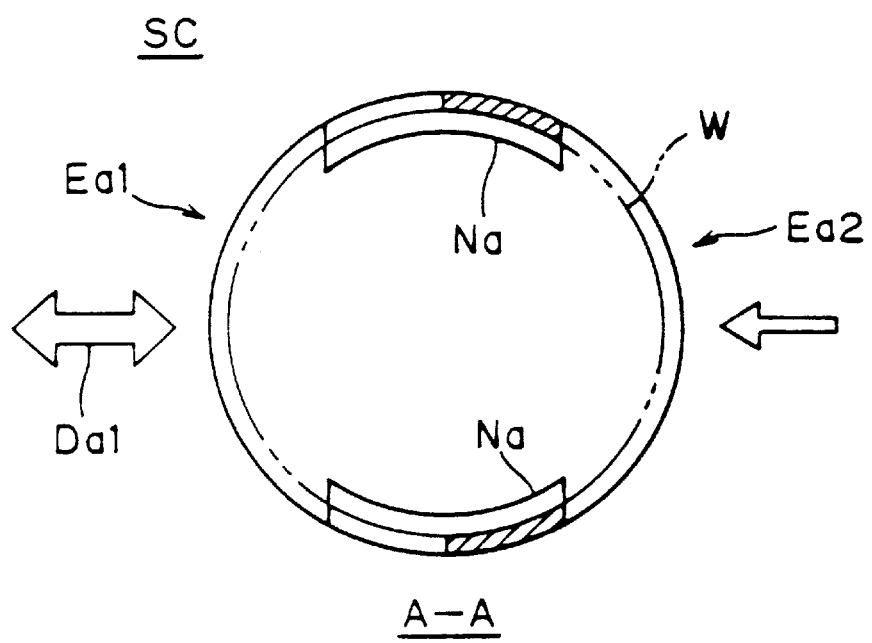

First, substrates W held in a common carrier SC are transferred from the outside of the apparatus and placed on a carrier placing stage 221 of the common carrier placing part 22. The carrier placing stage 221 is arranged in a Y direction at the common carrier placing part 22. The common carrier SC held in a special pod (not shown) is transferred over the carrier placing stage 221, and taken out of the special pod from underneath to be placed on the carrier placing stage 211 as shown in FIG. 1. As approximately cylindrical as shown in FIGS. 3A and 3B, the common carrier SC can store a plurality of substrates W in a horizontal attitude with racks Na supporting the substrates W. Further, the common carrier SC has a forward opening part Ea1 and a backward opening part Ea2 opposing each other, and as indicated by an arrow Da1, it can transfer the substrates W only through the forward opening part Ea1. At this time, the common carrier SC is placed on the carrier placing stage 221 so that the forward opening part Ea1 faces the turning part 23 and the backward opening part Ea2 faces the substrate transfer robot 21.

Once the common carrier SC is placed on the carrier placing stage 221 the substrate transfer robot 21 transfers the substrates W held in the common carrier SC into an exclusive carrier EC placed on the turning part 23.

Figure 4B:
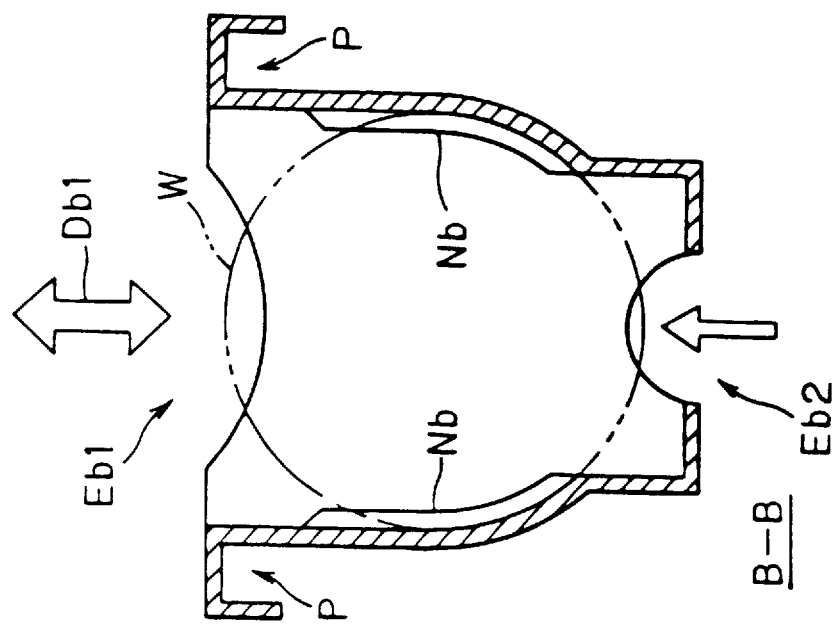
FIGS. 4A and 4B show an exclusive carrier.
Figure 4A:
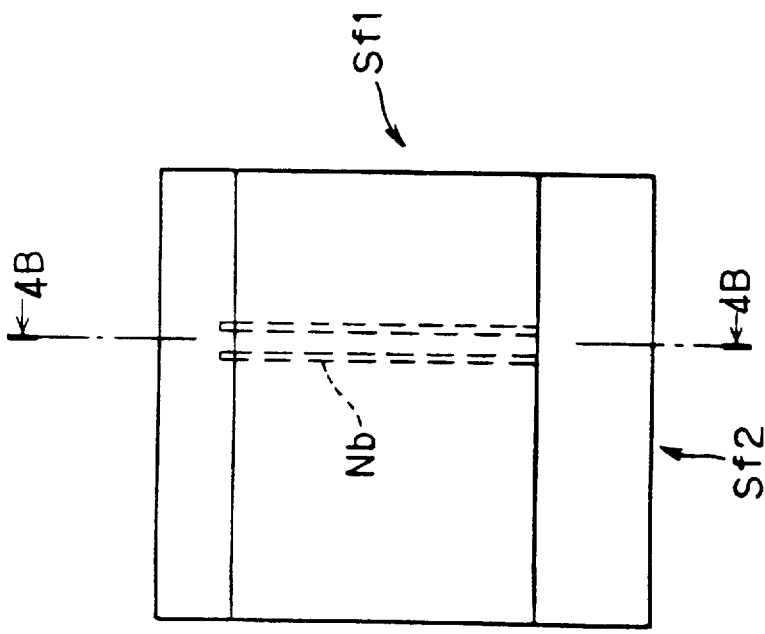

The exclusive carrier EC supports a plurality of substrates W by racks Nb as shown in FIGS. 4A and 4B, and can be used in either way to hold the substrates W in a horizontal attitude with a surface Sf1 as its bottom surface or to hold the substrates W in a vertical attitude with a surface Sf2 as its bottom surface. Further, the exclusive carrier EC has a forward opening part Eb1 and a backward opening part Eb2 opposing each other. Though the same as the common carrier SC in that the substrates W are transferred through the forward opening part Eb1 as indicated by an arrow Db1, the exclusive carrier EC, having handles P used for the transport of the exclusive carrier EC, differs from the common carrier SC in shape. For the transfer of the substrates W from the common carrier SC to the exclusive carrier EC, the exclusive carrier EC stands on the turning part 23 with the surface Sf1 as its bottom surface and the forward opening Eb1 facing the carrier placing stage 221.

Figure 5A:
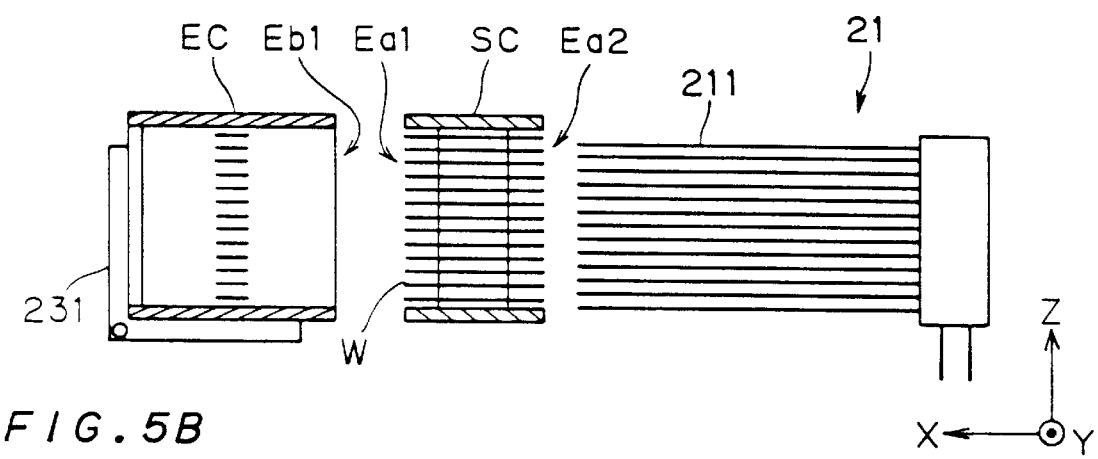
FIGS. 5A to 5C show an operation of a substrate transfer robot.
Figure 5B:
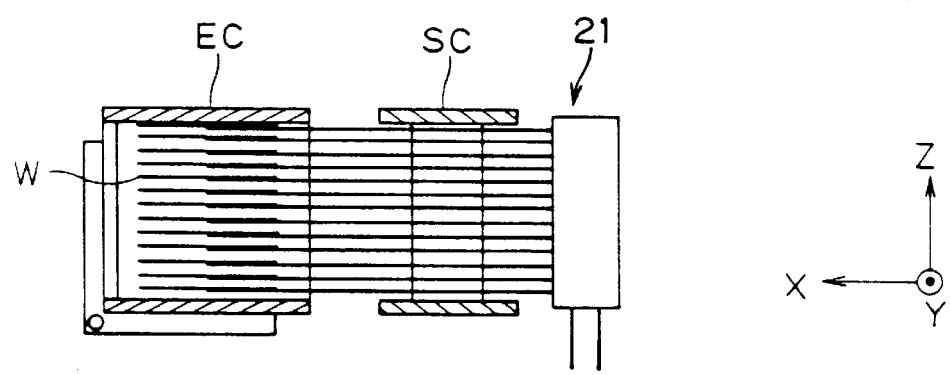
Figure 5C:
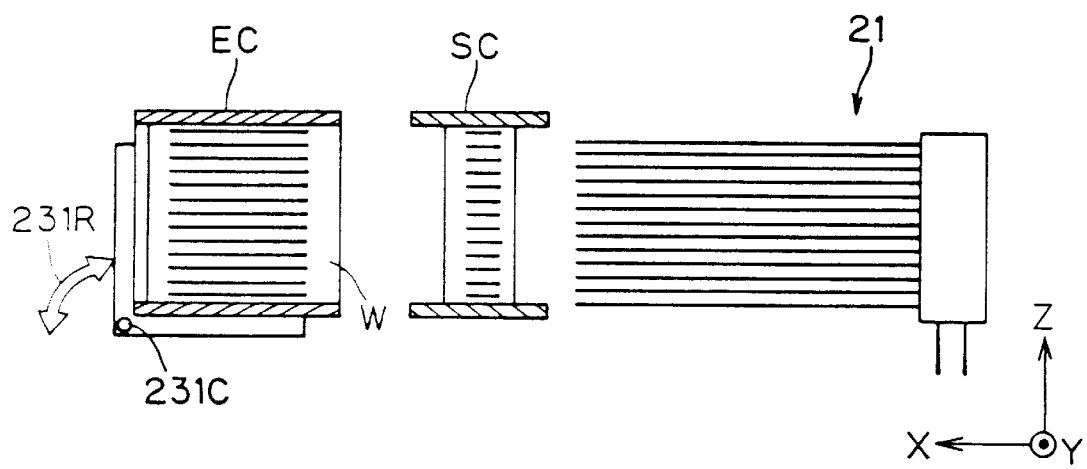

The substrate transfer robot 21 has a plurality of holding plates 211 provided for each of the substrates W held in the common carrier SC as shown in FIG. 5A, and a driving source 212 for moving the holding plates 211 (see FIG. 1). As shown in FIGS. 5B and 5C, the robot 21 moves up the holding plates 211 so as to lift the substrates W held in the common carrier SC, and transfers the substrates W into the exclusive carrier EC.

Figure 6A:
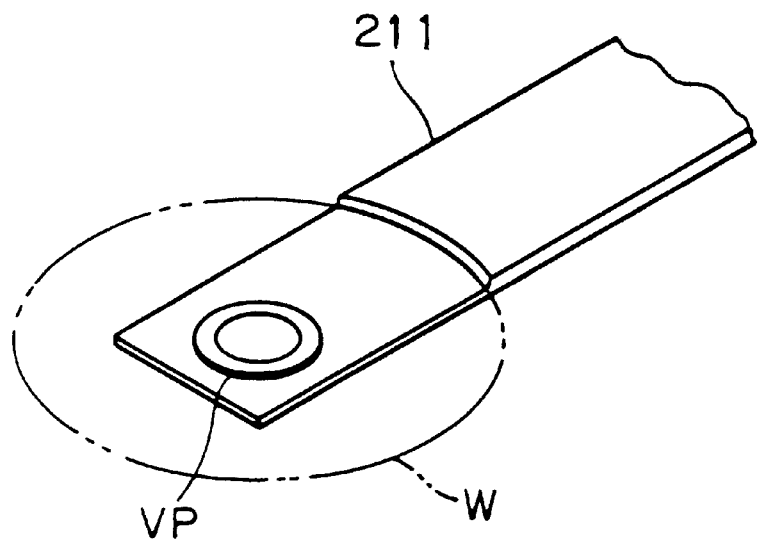
FIGS. 6A and 6B are perspective views showing the shapes of a holding plate.

More specifically, each of the holding plates 211 has, as shown in FIG. 6A, a vacuum chuck VP for holding a substrate W from underneath by vacuum suction. After sliding under each of the substrates W through the backward opening part Ea2 of the common carrier SC, the holding plates 211 moves upward to hold the substrates W by vacuum suction. The substrate transfer robot 21 then moves in a X direction as shown in FIG. 5B so that the substrates W are transferred through the forward opening part Ea1 of the common carrier SC and Eb1 of the exclusive carrier EC into the exclusive carrier EC, where the substrates W are placed on the racks Nb by moving down the holding plates 211 to release the substrates W. After the transfer of the substrates W, the substrate transfer robot 21 moves in the negative X direction as shown in FIG. 5C.

The substrate transfer robot 21 is movable in the X and Y directions as indicated by arrows 21X and 21Y in FIG. 2 so that the substrates W can be transferred into any carrier placing stage 221 arranged in the Y direction, and it is also movable in the Z direction to move the holding plates 211 as described in the above transfer operation.

Figure 7A:
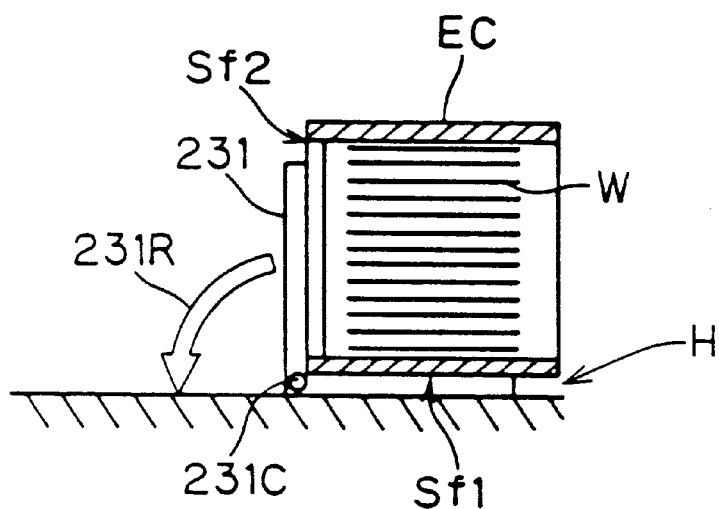
FIGS. 7A and 7B show an operation of a turning part.
Figure 7B:
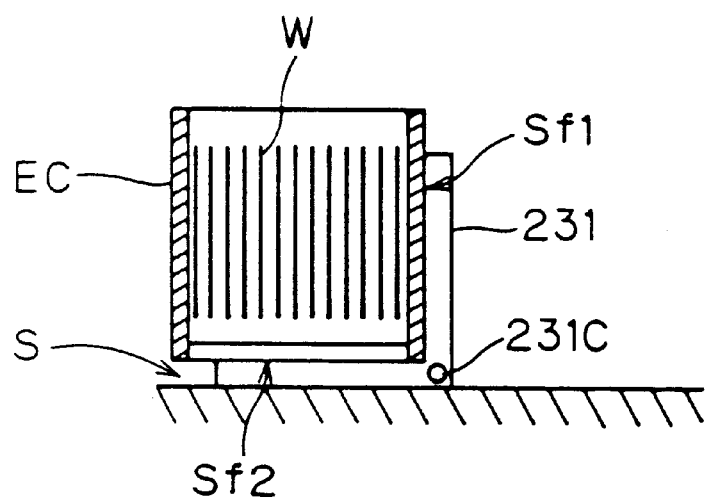

After the transfer of the substrates W is complete, the substrates W are turned from the horizontal attitude to a vertical attitude together with the exclusive carrier EC at the turning part 23. More specifically, since the exclusive carrier is placed on a turning stage 231 as shown in FIGS. 1, 7A and 7B, when the turning stage 231 turns 90 degrees around an horizontal axis 231C extending in the Y direction by a turning driving source (not shown) as indicated by an arrow 231R, the exclusive carrier EC turns from its horizontal storage position H at which the substrates W are held in a horizontal attitude as shown in FIG. 7A to its vertical storage position S at which the substrates W are held in a vertical attitude as shown in FIG. 7B (see FIG. 2). Along with the exclusive carrier EC, the substrates W held in the horizontal attitude as shown in FIG. 7A turn into a vertical attitude as shown in FIG. 7B. At this time, the bottom surface of the exclusive carrier EC changes from the surface Sf1 to the surface Sf2 shown in FIG. 4 This operation is also indicated by the arrow 231R in FIG. 2.

Following the turn of the exclusive carrier, two of a plurality of exclusive carriers EC on the turning part 23 are transported by the exclusive carrier transport robot 24 to two pushing-out parts 25 arranged in the Y direction, respectively. The exclusive carrier transport robot 24 is movable in the Y direction as indicated by an arrow 24Y in FIG. 2, rotatable on an axis extending in the Z direction as indicated by an arrow 24R, and further vertically movable in the Z direction. Held by the handles P shown in FIG. 4, the exclusive carriers EC are transported from the turning stage 231 to the pushing-out parts 25.

Figure 8A:
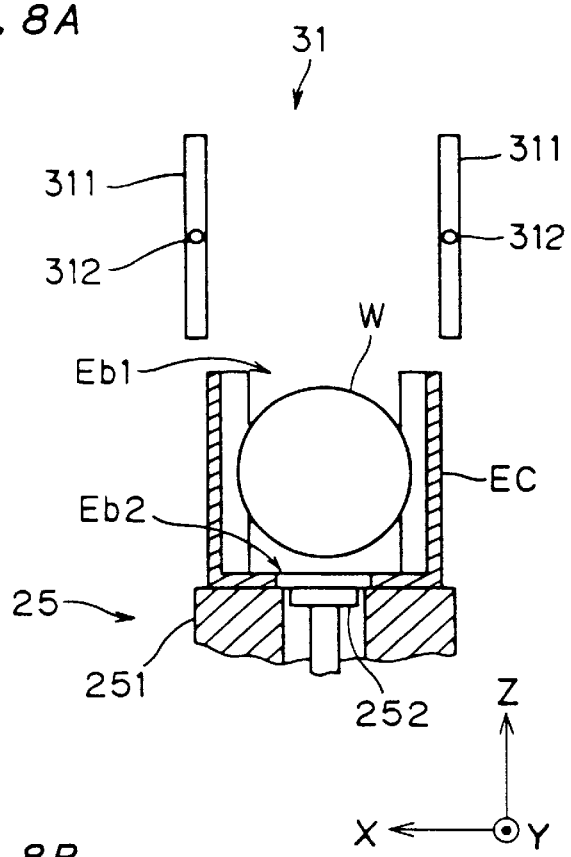
FIGS. 8A and 8B show an operation of a pushing-out part.

Each of the pushing-out parts 25 has a rotary stage 251 rotatable on an axis extending in the Z direction as shown in FIG. 8A, and a pushing stage 252 vertically movable in the Z direction. The exclusive carriers placed on the respective pushing stages 252 rotates 90 degrees on an axis extending in the Z direction as indicated by an arrow 25R in FIG. 2, by which a normal of the main surfaces of the substrates W held in the exclusive carriers EC (a line perpendicular to the surfaces of the substrates W) turns in the Y direction.

Figure 8B:
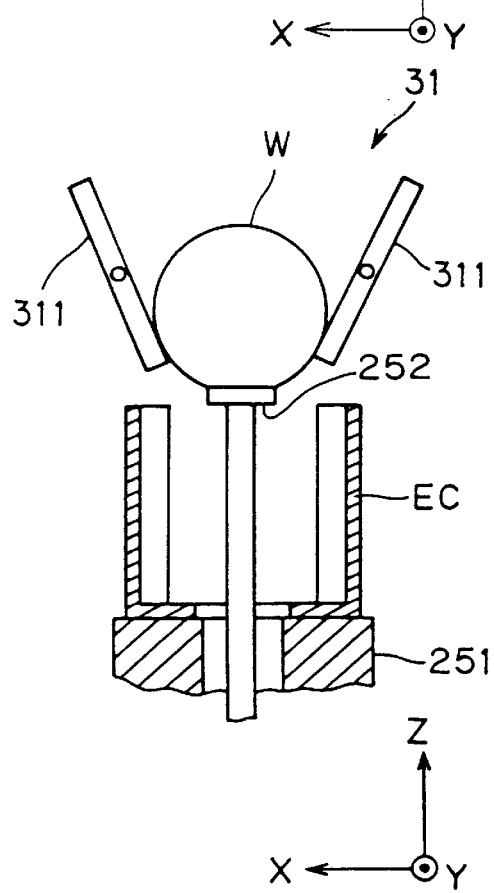
Figure 9:
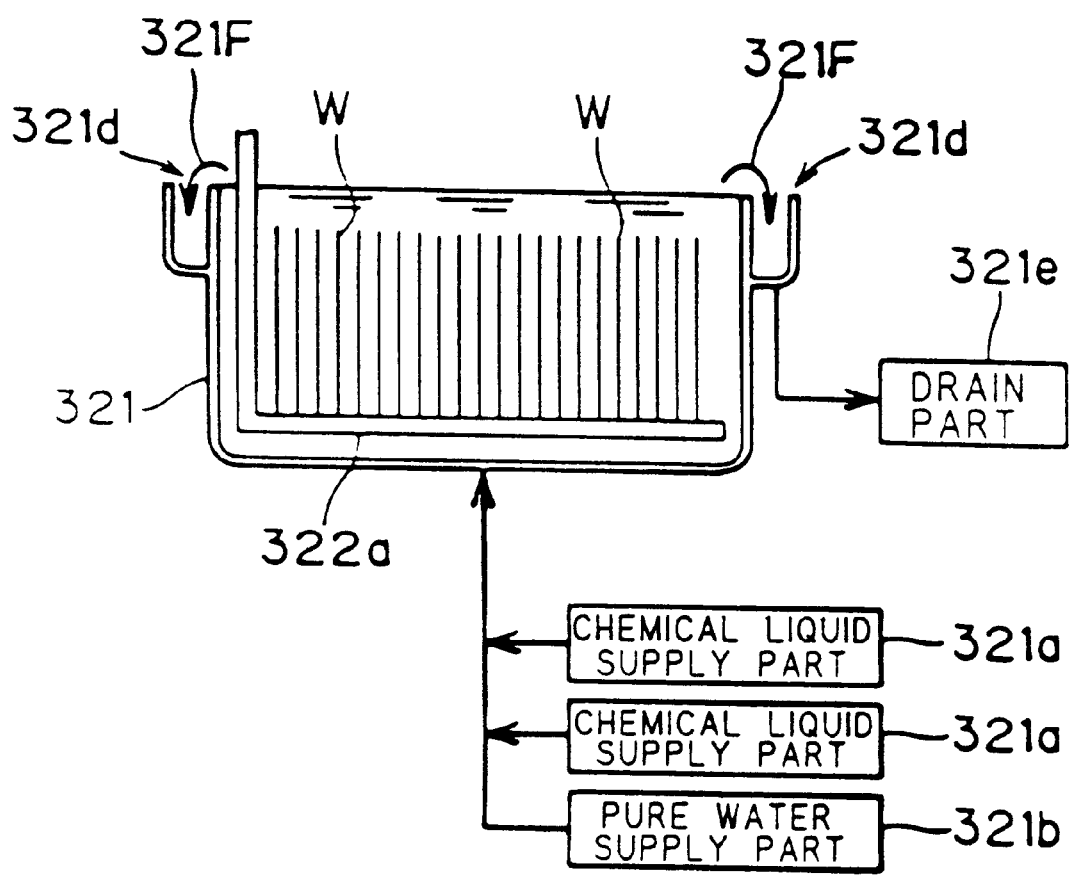
FIG. 9 shows a structure of a cleaning part.

Next, each of the pushing stages 252 moves upward to enter the exclusive carrier EC through the backward opening part Eb2 of the exclusive carrier EC, and pushes the substrates W out of the exclusive carrier EC through the forward opening part Eb1. Then, the two pushing stages 252 approach each other in the axial Y direction to lessen the space between the groups of substrates W thereon. The substrates W are then transferred to the substrate transport robot 31 as shown in FIG. 8B and the pushing stages 252 move downward. This operation is performed at the two pushing-out parts 25 at the same time, so that the substrate transport robot 31 receives the substrates W held in the two exclusive carriers at the same time. The pushing stage 252 has grooves (abutting on the exterior of the substrate W) provided for each of the substrates W to support the substrates W in the vertical attitude. Further, the emptied exclusive carrier EC is transported to the carrier cleaning part 26 by the exclusive carrier transport robot 24 for cleaning, and, after the cleaning, placed again on the pushing-out part 25 to hold the cleaned substrates W.

The substrate transport robot 31 has two holding plates 311 each extending in the Y direction separately as shown in FIGS. 1, 8A and 8B and rotatable on an axis 312 extending in the Y direction. The substrates W pushed out at the pushing-out part 25 are transferred between the holding plates 311, and the holding plates 311 rotate so as to hold the substrates W therebetween. In this way, the substrates W are held by the substrate transport robot 31 as shown in FIG. 8B. Namely, the pushing-out parts 25 act as relay stations for transferring the substrates W to the substrate processing unit 3. Each of the holding plates 311 of the substrate transport robot 31 has grooves (abutting on the exterior of the substrates W) provided for each of the substrates W to hold the substrates W in the vertical attitude.

The substrate transport robot 31 is movable in the X direction, as indicated by an arrow 31X in FIG. 2, so as to transport the substrates W over the plurality of cleaning parts 32 and the drying part 33.

Upon receipt of the substrates W from the pushing-out parts 25, the substrate transport robot 31 transports the substrates W to either one of the cleaning parts 32 not in process. As shown in FIGS. 1 and 2, each of the cleaning parts 32 has a dipping bath 321 for retaining processing fluid for cleaning, and a vertical moving robot 322 which is vertically movable with the substrates W on a holding stage 322a. The vertical moving robot 322 moves up the holding stage 322a to receive the substrates W from the substrate transport robot 31, while the substrate transport robot 31 rotates the holding plates 311 holding the substrates W therebetween to release the substrates W. Thus, the released substrates W are held on the holding stage 322a of the vertical moving robot 322. The holding stage 322a also has a plurality of grooves to hold the substrates W in the vertical attitude.

Receiving the substrates W from the substrate transport robot 31, the vertical moving robot 322 moves down the holding stage 322a to dip the substrates W into processing fluid retained in the dipping bath 321.

The dipping bath 321 includes a plurality of chemical liquid supply parts 321a and a pure water supply part 321b from which a plurality of types of chemical liquid or pure water are supplied through a supply tube. The dipping bath 321 further includes a drain 321d for receiving the processing fluid spilled over the dipping bath 321 as indicated by arrows 321F, and a drain part 321e for draining the processing fluid received from the drain 321d through a drain tube. Such a structure allows the dipping bath 321 to replace the processing fluid therein by various chemical liquid (diluted by pure water) or pure water while dipping the substrates W, thereby giving an appropriate cleaning to the substrates W.

After the cleaning is complete at the cleaning part 32, the holding stage 322a of the vertical moving robot 322 moves upward to take the substrates W out of the processing fluid. Then, the substrate transport robot 31 receives the substrates W from the holding stage 322a in reverse order to how the substrates W are transferred to the vertical moving robot 322, and transports them to the drying part 33.

In the drying part 33, a vertical moving robot (not shown) receives the substrates W from the substrate transport robot 31 as performed in the cleaning part 32, and dries the substrates W. After the drying, the substrates W are transferred again to the substrate transport robot 31 which then transports the substrates W to the pushing-out parts 25.

In this way, the substrates W cleaned in the substrate processing unit 3 are returned again to the pushing-out part 25 and stored in the common carrier SC placed on the carrier placing stage 221 in reverse order to how the substrates W are transferred from the carrier placing unit 2 to the substrate processing unit 3. More specifically, the substrates W are stored in the exclusive carrier EC in the vertical attitude at the pushing-out part 25; the exclusive carrier EC is transported to the turning part 23 by the exclusive carrier transport robot 24; the exclusive carrier EC turns from the vertical attitude to a horizontal attitude together with the substrates W at the turning part 23; and the substrates W held in the exclusive carrier EC are transferred into the common carrier SC placed on the common carrier placing part 22 by the substrate transfer robot 21. By this time, the common carrier SC has been replaced by another common carrier SC for storing the cleaned substrates W by performing the transfer of the common carrier SC into and out of the apparatus while the substrates W are cleaning.

In the foregoing description about the structure and operation of the substrate processing apparatus 1, the substrates W held in the common carrier SC are transferred into the exclusive carrier in a horizontal attitude, and then turned into a vertical attitude together with the exclusive carrier. This allows a speedy and simple turn of the substrates W inside the apparatus. Further, such a simple mechanism of the apparatus suppresses generation of particles, thereby improving the substrates W in quality. Consequently, the substrate processing apparatus for processing substrates in a vertical attitude can be easily introduced into a substrate processing system which consists of a plurality of substrate processing apparatuses, even if the substrates are transferred in a horizontal attitude between the apparatuses. Furthermore, since the turning stage 231 turns around the horizontal axis 231C, the horizontal storage position H of the exclusive carrier EC at which the substrates W are held in a horizontal attitude, becomes adjacent to its vertical storage position S at which the substrates W are held in a vertical attitude, which minimizes the size of the substrate processing apparatus 1.

2. Second Preferred Embodiment

Figure 10:
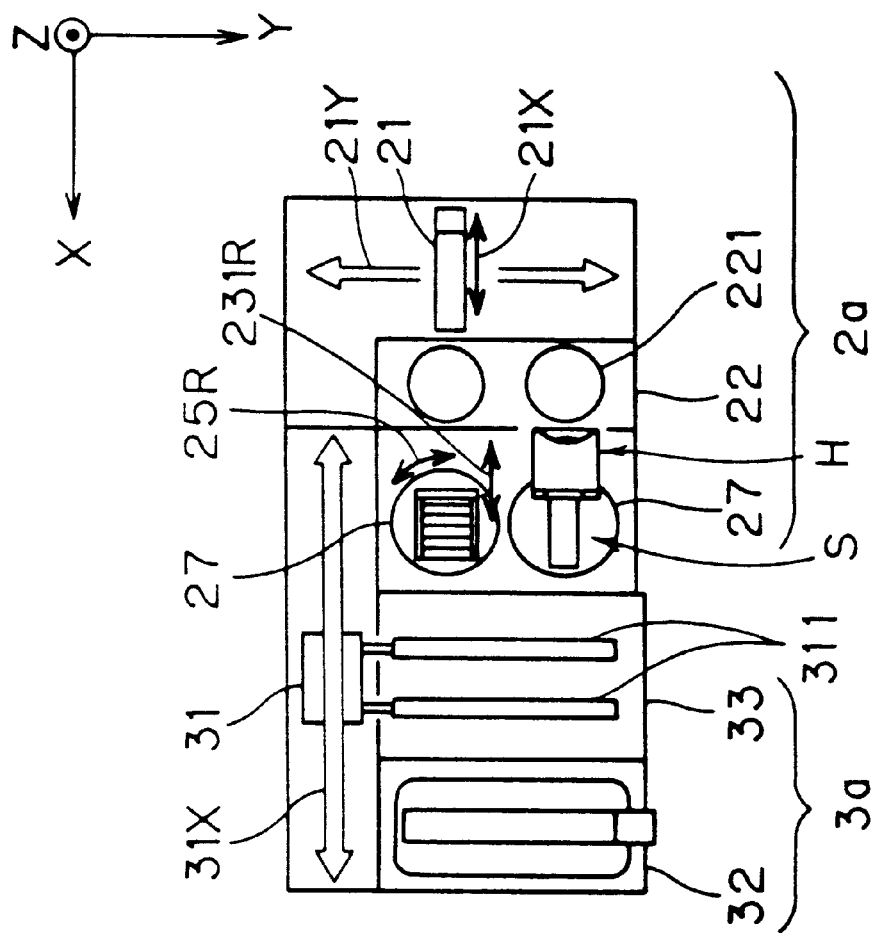
FIG. 10 is a plan view of the substrate processing apparatus according to the present invention.

FIG. 10 is a general plan view of a substrate processing apparatus 1a according to a second preferred embodiment of the present invention.

The substrate processing apparatus 1a roughly consists of a carrier placing unit 2a and a substrate processing unit 3a. The carrier placing unit 2a includes a substrate transfer robot 21, a common carrier placing part 22, and a turning and pushing-out part 27. The substrate processing unit 3a includes a substrate transport robot 31, a cleaning part 32, and a drying part 33. The components except the turning and pushing-out part 27 are almost the same as those of the substrate processing apparatus 1 according to the first preferred embodiment.

The turning and pushing-out part 27 and the substrate transport robot 31 form a transport system for transporting the substrates W between the turning and pushing-out part 27 and the cleaning part 32 or the drying part 33.

In the substrate processing apparatus 1a, two common carriers SC holding the substrates W in a horizontal attitude are placed on two carrier placing stages 221 of the common carrier placing part 22, respectively, as in the first preferred embodiment. The substrates W held in the common carriers SC are, as in the first preferred embodiment, transferred to the turning and pushing-out part 27 by the substrate transfer robot 21.

The turning and pushing-out part 27 is the combination of the turning part 23 and the pushing-out part 25 of the first preferred embodiment. The structure is in FIGS. 11A to 11C, where the same reference numerals are used to designate the same components as those of the turning part 23 in FIGS. 7A and 7B and those of the pushing-out part 25 in FIGS. 8A and 8B.

Figure 11A:
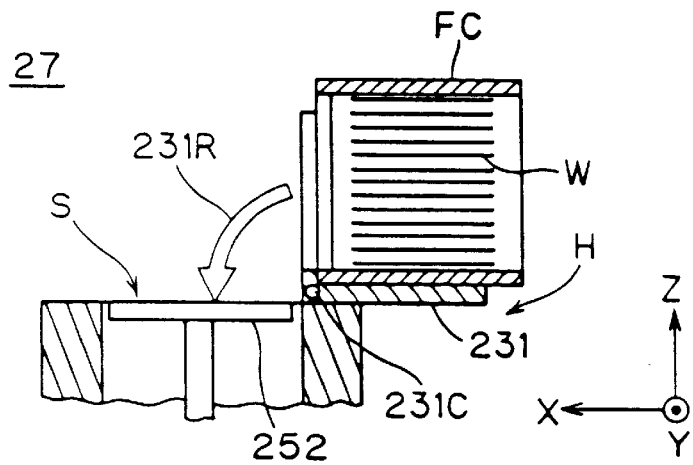
FIGS. 11A to 11C show an operation of a turning and pushing-out part.
Figure 11B:
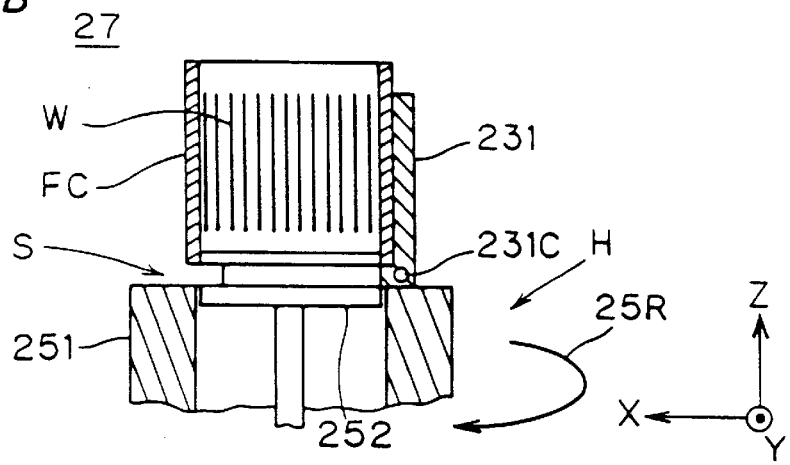
Figure 11C:
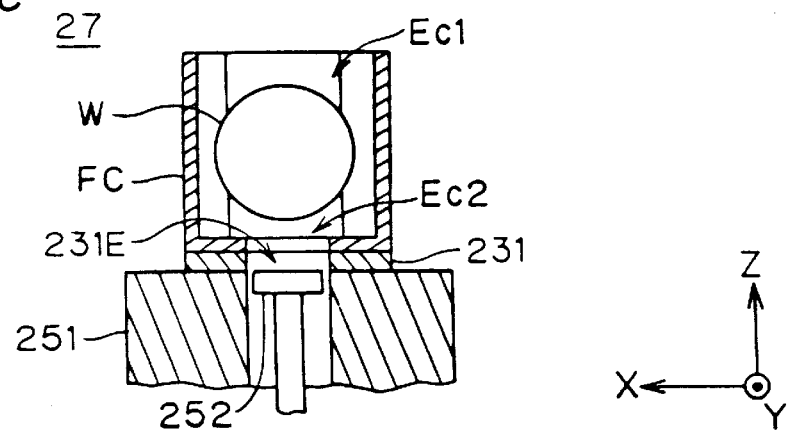

As shown in FIGS. 11A to 11C, the turning and pushing-out part 27 includes a rotary stage 251 rotatable on an axis extending in the Z direction, and a pushing stage 252 vertically movable in the Z direction, like the pushing-out part 25 of the first preferred embodiment.

Provided on the rotary stage 251 is a turning stage 231 supported so as to be rotatable 90 degrees on an horizontal axis of rotation 231C fixed to the rotary stage 251, as indicated by an arrow 231R.

A carrier part FC provided on the turning stage 231 is similar to the exclusive carrier EC of the first preferred embodiment in shape, but remarkably different in that it is fixed to the turning stage 231 so as not to be separated.

For the transfer of the substrates W from the common carrier SC to the carrier part FC, the carrier part FC stands, as shown in FIG. 11A, at its horizontal storage position H with the substrates W held therein in a horizontal attitude. Thus, the carrier part FC and the common carrier SC are arranged in the similar way to the exclusive carrier EC and the common carrier SC shown in FIG. 5A, so that the substrate transfer robot 21 can transport the substrates W from the common carrier SC to the carrier part FC.

After the transfer of the substrates W, the turning stage 231 turns on the axis 231C extending in the Y direction as indicated by the arrow 231R in FIG. 11A, by which the carrier FC stands at its vertical storage position S with the substrates W held therein in a vertical attitude. In this way, together with the carrier part FC, the substrates W turns into a vertical attitude as shown in FIG. 11B.

Then, the turning stage 251 rotates 90 degrees on an axis extending in the Z direction as indicated by an arrow 25R, along with the carrier part FC and the substrates W. Thus, a normal of the substrates W (a line perpendicular to the surfaces of the substrates W) turns in the Y direction as shown in FIG. 11C.

After the normal of the substrates W (a line perpendicular to the surfaces of the substrates W) turns in the Y direction, the substrates W are pushed up by the pushing stage 252 as in the first preferred embodiment. Then, the two pushing stages 252 approach each other in the axial Y direction to lessen the space between the groups of the substrates W thereon. The substrates W are then transferred to the substrate transport robot 31. As shown in FIG. 10, two turning and pushing-out parts 27 are arranged in the Y direction, and transfer the substrates W thereon to the substrate transport robot 31 at the same time. Further, since the pushing stage 252 pushes up the substrates W, like the exclusive carrier EC of the first preferred embodiment, the carrier part FC has a backward opening part Ec2 opposing to a forward opening part Ec1 for the entrance of the substrates W as shown in FIG. 11C. Also, the turning stage 231 has an opening part 231E for the entrance of the pushing stage 252 in a corresponding position to the backward opening part Ec2.

Upon receipt of the substrates W, the substrate transport robot 31 transports the substrates W to the cleaning part 32, where the substrates W are cleaned and returned to the substrate transport robot 31. Then, the substrate transport robot 31 transports the substrates W to the drying part 33, where the substrates W are dried and returned to the substrate transport robot 31. The substrates W are then transported to the turning and pushing-out part 27 by the substrate transport robot 31 and returned to the common carrier SC. Namely, the substrates W held in the vertical attitude turns into a horizontal attitude and returned to the common carrier SC in reverse order to how they are transferred into the apparatus 1a and transported to the substrate transport robot 31.

As described above, in the substrate processing apparatus 1a according to the present invention, a plurality of substrates W are turned at a time together with the carrier part FC and transferred from and to the substrate transport robot 31 at the turning and pushing-out part 27. This allows a speedy and simple turn of the substrates W inside the apparatus. Further, such a simple mechanism suppresses generation of particles, thereby improving the substrates W in quality. Furthermore, forming the turning stage 231 on the rotary stage 251 downsizes the apparatus as a whole.

3. Third Preferred Embodiment

Figure 12:
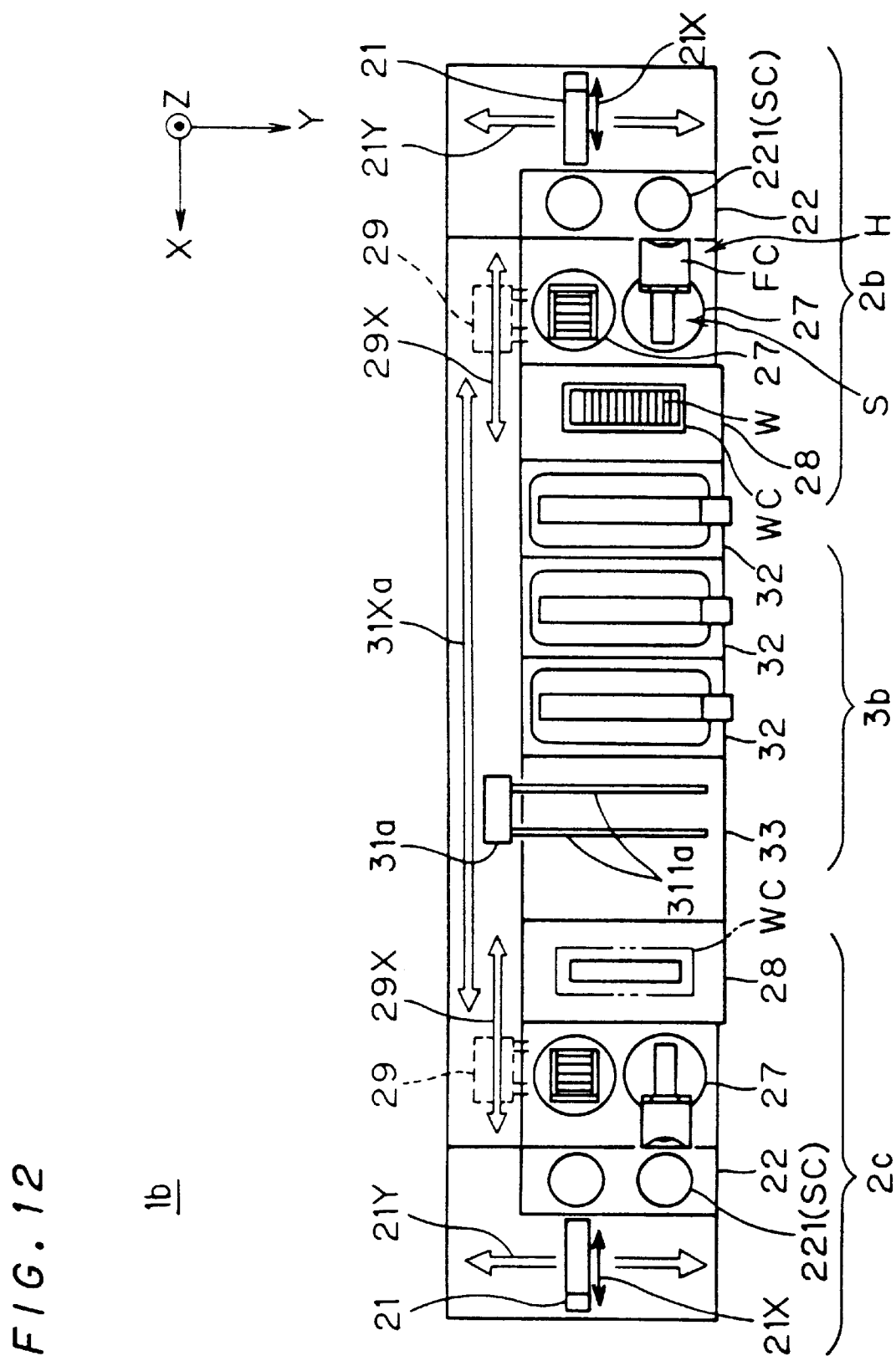
FIG. 12 is a plan view of the substrate processing apparatus according to the present invention.

FIG. 12 is a plan view of a substrate processing apparatus 1b of a third preferred embodiment according to the present invention. The substrate processing apparatus 1b cleans the substrates W as in the first and second preferred embodiments, but differs in that the substrates are held in a carrier for cleaning (hereinafter referred to as a cleaning carrier) WC throughout the cleaning process.

The substrate processing apparatus 1b roughly consists of a first carrier placing unit 2b, a substrate processing unit 3b, and a second carrier placing unit 2c all arranged in the X direction. The substrates W held in a common carrier SC are transferred from the outside of the apparatus to the first carrier placing unit 2b, cleaned in the substrate processing unit 3b, and transferred from the second carrier placing unit 2c to the outside of the apparatus while held in the common carrier SC.

The first carrier placing unit 2b includes a substrate transfer robot 21, a common carrier placing part 22, a turning and pushing-out part 27, a cleaning carrier transfer part 28, and a substrate transport robot 29. The substrate transfer robot 21, the common carrier placing part 22, and the turning and pushing-out part 27 are the same as those in the second preferred embodiment. The cleaning carrier transfer part 28 places the cleaning carrier WC thereon, while the substrate transport robot 29, which is movable in the X direction as indicated by an arrow 29X, transports the substrates W from the turning and pushing-out part 27 to the cleaning carrier transfer part 28.

The substrate processing unit 3b includes a cleaning carrier transport robot 31a, a plurality of cleaning parts 32, and a drying part 33. The cleaning parts 32 and the drying part 33 are almost the same as those of the second preferred embodiment. Upon the receipt of the cleaning carrier WC holding the substrates W from the cleaning carrier transfer part 28, the cleaning carrier transport robot 31 transports the cleaning carrier WC in the X direction as indicated by an arrow 31Xa. In accordance with this, the cleaning parts 32 and the drying 33 also handle the substrates W together with the cleaning carrier WC, which is different from the second preferred embodiment.

The second carrier placing unit 2c is similar to the first carrier placing unit 2b, except that each of the components is symmetrical to that of the first carrier placing unit 2b with the substrate processing unit 3b put therebetween.

The turning and pushing-out parts 27 of the first and second carrier placing units 2b and 2c, the substrate transport robot 29, and the cleaning carrier transport robot 31a form a transport system for transporting the substrates W between the turning and pushing-out parts 27 and the cleaning parts 32 or the drying part 33.

In the substrate processing apparatus 1b, a common carrier SC holding the substrates W in a horizontal attitude is placed on a carrier placing stage 221 of the common carrier placing part 22. As in the second preferred embodiment, the substrate transfer robot 21 transfers the substrates W into a carrier part FC of the turning and pushing-out part 27, where the substrates W are turned into a vertical attitude, and pushed up after rotated in a predetermined way.

Figure 13:
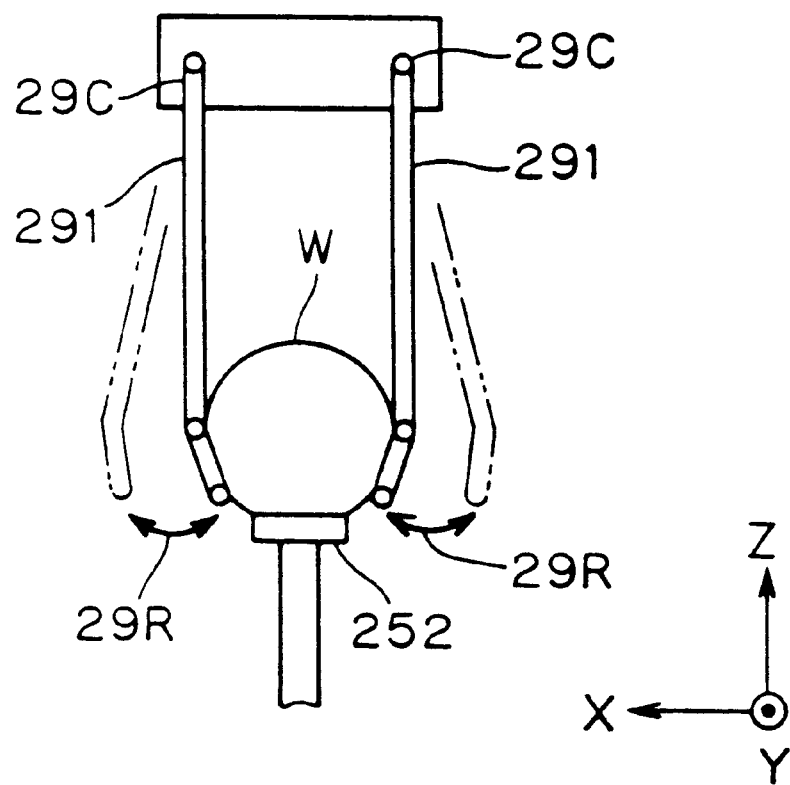
FIG. 13 shows a substrate holding operation of the substrate transport robot.

The substrates W pushed up at the turning and pushing-out part 27 are transferred to the substrate transport robot 29 which, as shown in FIG. 13, holds the substrates W by two arms 291 which are rotatable on two axes 29C each extending in the Y direction, as indicated by arrows 29R. Since the axes 29C move so as to extend in the Y direction, the substrates W are transportable in the Y direction. Further, grooves are formed where the arms 291 abut on the substrates in order to hold the substrates W in the vertical attitude.

Upon receipt of the substrates W, the substrate transport robot 29 transports the substrates W to the cleaning carrier transfer part 28. More specifically, having a similar structure to that shown in FIG. 8, the pushing stage moves upward from underneath the cleaning carrier WC, and moves downward to store the substrates W into the cleaning carrier WC. This operation is repeated twice for each cleaning carrier so that the substrates W placed on the two turning and pushing-out parts 27 are stored together in one cleaning carrier WC.

Once the substrates W are held in the cleaning carrier WC, the cleaning carrier WC itself is pushed up at the cleaning carrier transfer part 28, and transferred to the cleaning carrier transport robot 31a. As shown in FIG. 12, the cleaning carrier transport robot 31a has two rodlike arms 311a each extending in the Y direction to hold the cleaning carrier WC therebetween.

The cleaning carrier transport robot 31a transports the received cleaning carrier WC to a predetermined cleaning part 32, where a vertical moving robot receives the cleaning carrier WC and dips it into processing fluid to clean the substrates W. After the cleaning, the cleaning carrier transport robot 31a receives the cleaning carrier WC from the vertical moving robot and transports it to the drying part 33, where the cleaning carrier WC is dried.

After the drying, the cleaning carrier transport robot 31a receives the cleaning carrier WC from the drying part 33, and transports it to the cleaning carrier transfer part 28 of the second carrier placing unit 2c. Then, the substrates held in the cleaning carrier WC are transferred to a common carrier SC placed on the common carrier part 22 of the second carrier placing unit 2c in reverse order to the operation of the first carrier placing unit 2b, and transferred to the outside of the apparatus 1b. Namely, in the substrate processing apparatus 1c, the first carrier placing unit 2b transfers the substrates W only from the common carrier placing part 22 to the substrate processing unit 3b, while the second carrier placing unit 2c transfers the substrates W only from the substrate processing unit 3b to the common carrier placing unit 22.

In the above-described substrate processing apparatus 1b of the third preferred embodiment, when stored into the cleaning carrier WC in a vertical attitude, a plurality of substrates W can be turned into a horizontal attitude at a time at the turning and pushing-out part 27. This allows a speedy and simple turn of the substrates W inside the apparatus. Further, such a simple mechanism suppresses generation of particles, thereby improving the substrates W in quality.

4. Fourth Preferred Embodiment

Figure 14A:
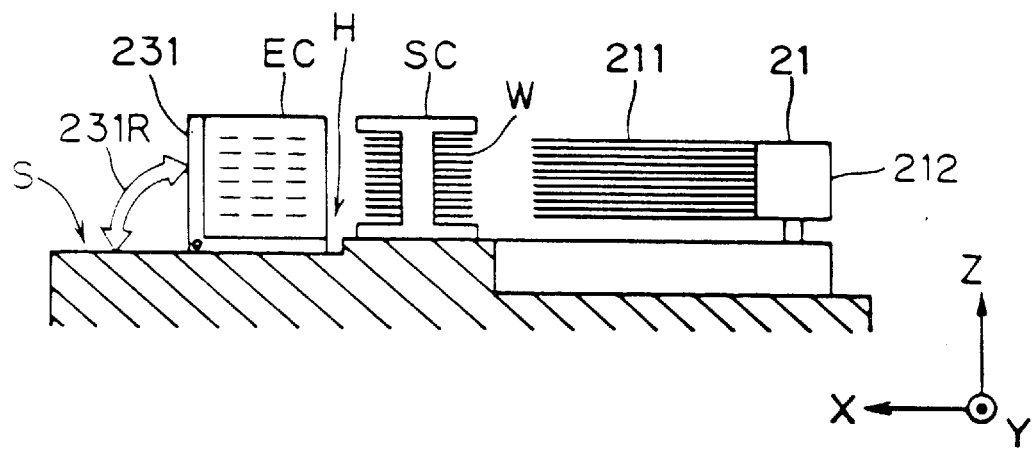
FIG. 14A is a front view and FIG. 14B is a plan view of a substrate transfer apparatus according to the present invention.
Figure 14B:
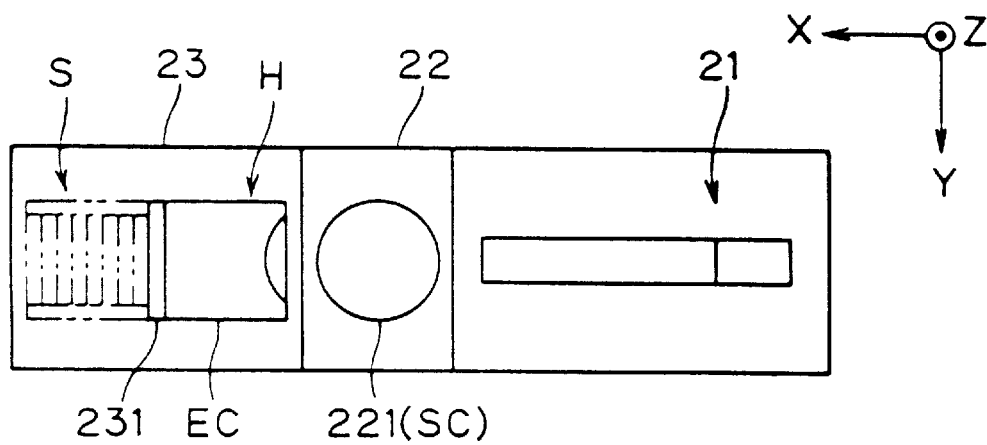

FIG. 14A is a front view and FIG. 14B is a plan view of a substrate transfer apparatus 2d according to the present invention.

The substrate transfer apparatus 2d comprises a substrate transfer robot 21, a common carrier placing part 22, and a turning part 23, and these structures and operations are almost similar to those of the substrate processing apparatus 1 of the first preferred embodiment. More specifically, the substrate transfer robot 21 has a plurality of holding plates 211 movable in the X and Z directions by a driving source 212. Using the holding plates 211, the substrates W are transferred between a common carrier SC placed on a carrier placing stage 221 of the common carrier placing part 22 and an exclusive carrier EC placed on the turning part 23.

When the turning stage 231 turns 90 degrees around an horizontal axis extending in the Y direction as indicated by an arrow 231R, the exclusive carrier placed on the turning stage 231 also turns 90 degrees from its horizontal storage position H to its vertical storage position S. Along with this, a plurality of substrates W held in the exclusive carrier EC turns into a vertical attitude.

The above-described substrate transfer apparatus 2d allows the substrates W held in the common carrier SC in the horizontal attitude to be transferred and stored into the exclusive carrier in a vertical attitude. Further, in reverse order to this operation, the substrates W held in the exclusive carrier EC in the vertical attitude can be transferred and stored into the common carrier SC in a horizontal attitude. Thus, even if the substrate processing system holding and transferring the substrates W in a vertical attitude is modified to transfer the substrates W in a horizontal attitude, its substrate processing apparatus for processing the substrates W in a vertical attitude can be used with little modification by applying this substrate transfer apparatus 2d. This leads to an economical operation of the substrate processing system.

5. Modification

The substrate processing apparatus and the substrate transfer apparatus according to the present invention have been described hereinbefore. The present invention is, however, not limited to the above preferred embodiments.

Although the apparatus for cleaning and drying the substrates W is used in the aforementioned first to third preferred embodiments, as long as a plurality of substrates W are processed in a vertical attitude, the present invention is applicable in, for example, a thermal treatment apparatus.

In the first preferred embodiment, as a method for transferring substrates W into the apparatus, a common carrier SC is transferred while held in a special pod, and taken out of the special pod to be placed on the carrier placing stage 221. The special pod is, of course, replaceable by other robots.

Figure 6B:
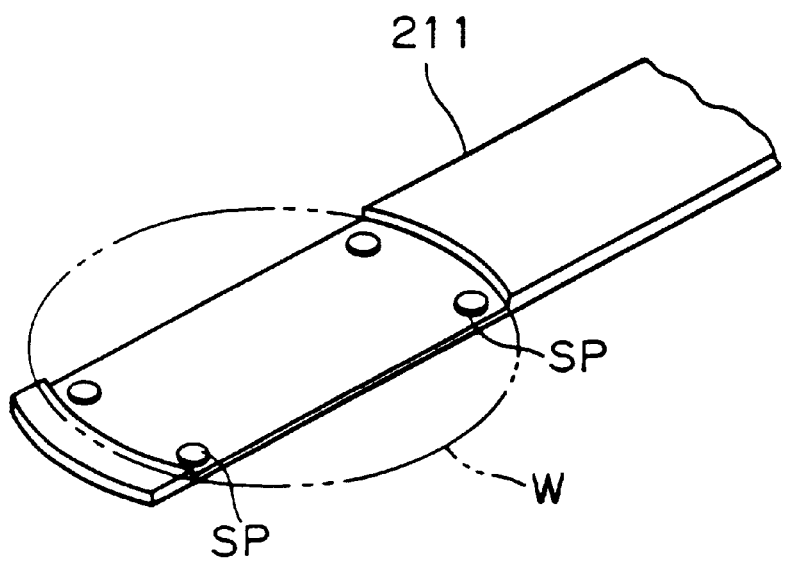

Although, in the first to fourth preferred embodiments, a plurality of holding plates 211 each having a vacuum chunk VP as shown in FIG. 6A are used to transfer the substrates W from the common carrier SC to the exclusive carrier EC, the holding plates 211 may take another form. For example, they may have a plurality of supporting pads SP as shown in FIG. 6B.

The common carrier SC and the exclusive carrier EC, or the carrier part FC, do not always have to be opposed to each other. They may be arranged apart as long as the substrate transfer robot 21 can transfer the substrates W.

Further, the number of holding plates 211 of the substrate transfer robot 21 does not always have to be equal to the number of substrates W held in the common carrier SC or the exclusive carrier EC. For example, the following case may be possible: the common carrier SC can store 25 substrates W; the exclusive carrier EC can store So substrates W; and the substrate transfer robot 21 can hold 5 substrates W at a time. In this case, instead of the transfer methods of the aforementioned preferred embodiments, the substrate transfer robot 21 repeatedly transfers 5 substrates W until all the substrates W held in the two common carriers SC are transferred into one exclusive carrier EC.

In the first preferred embodiment, the processing fluid is replaced by chemical liquid or pure water in the dipping bath 321, which, however, may not be necessary by providing a plurality of dipping bathes 321 each retaining a different type of processing fluid. In that case, the substrate transport robot 31 may transport the substrates W sequentially to the respective dipping bathes 321.

In the first and second preferred embodiments, although transferred only through one common carrier placing part 22, the substrates W may be transferred through two common carrier placing parts as in the third preferred embodiment. On the contrary, in the third preferred embodiment, the substrates W may be transferred only through one common carrier placing part.

Further, the substrate transport robots 31, 29 or the cleaning carrier transport robot 31a may take another form to hold the substrates W. Also, the other components can be modified in various ways.

While the invention has been described in detail, the foregoing description is in all aspects illustrative and not restrictive. It is understood that numerous other modifications and variations can be devised without departing from the scope of the invention.

We claim:

1. An apparatus for processing substrates, comprising:

transfer means for transferring a plurality of substrates held in a horizontal attitude from a first carrier to a second carrier;

turning means for turning said second carrier, to thereby turn said plurality of substrates from the horizontal attitude to a vertical attitude;

processing means for processing said plurality of substrates held in the vertical attitude; and transport system for transporting said plurality of substrates held in the vertical attitude from said turning means to said processing means.

2. The apparatus for processing substrates in accordance with claim 1, wherein said transport system transports said plurality of substrates held in the vertical attitude from said processing means to said turning means, said turning means turns said second carrier, to thereby turn said plurality of substrates from the vertical attitude to the horizontal attitude, and said transfer means transfers said plurality of substrates held in the horizontal attitude from said second carrier to said first carrier.

3. The apparatus for processing substrates in accordance with claim 1, wherein said transport system comprises:

carrier transport means for transporting said second carrier holding said plurality of substrates in the vertical attitude from said turning means to a predetermined place;

take-out means for taking out said plurality of substrates held in the vertical attitude from said second carrier placed in said predetermined place; and substrate transport means for transporting said plurality of substrates held in the vertical attitude from said take-out means to said processing means.

4. The apparatus for processing substrates in accordance with claim 1, wherein said transport system comprises:

take-out means for taking out said plurality of substrates held in the vertical attitude from said second carrier which is placed on said turning means; and substrate transport means for transporting said plurality of substrates held in the vertical attitude from said take-out means to said processing means.

5. The apparatus for processing substrates in accordance with claim 1, wherein said transport system comprises:

a first transport system for transporting said plurality of substrates held in the vertical attitude from said second carrier to a third carrier placed on a predetermined place; and a second transport system for transporting said third carrier from said predetermined place to said processing means.

6. The apparatus for processing substrates in accordance with claim 1, wherein said transfer means comprises a plurality of holding plates each capable of holding a substrate.

7. The apparatus for processing substrates in accordance with claim 6, wherein each of said plurality of holding plates has a vacuum chuck for chucking a substrate.

8. The apparatus for processing substrates in accordance with claim 6, wherein said plurality of holding plates slide into a backward opening part of said first carrier, to thereby move said plurality of substrates from a forward opening part of said first carrier into a forward opening part of said second carrier.

9. The apparatus for processing substrates in accordance with claim 1, wherein said turning means comprises a turning stage for holding said second carrier, and said turning stage is operable to turn around a horizontal axis.

10. The apparatus for processing substrates in accordance with claim 1, wherein said processing means comprises a processing unit of a dip type into which said plurality of substrates are dipped.

11. An apparatus for transferring substrates between carriers, comprising:

transfer means for transferring a plurality of substrates held in a horizontal attitude from a first carrier to a second carrier; and turning means for turning said second carrier, to thereby turn said plurality of substrates from the horizontal attitude to a vertical attitude.

12. The apparatus for transferring substrates in accordance with claim 11, wherein said turning means turns said second carrier, to thereby turn said plurality of substrates from the vertical attitude to the horizontal attitude, and said transfer means transfers said plurality of substrates held in the horizontal attitude from said second carrier to said first carrier.

13. The apparatus for transferring substrates in accordance with claim 11, wherein said transfer means comprises a plurality of holding plates each capable of holding a substrate.

14. The apparatus for transferring substrates in accordance with claim 13, wherein each of said plurality of holding plates has a vacuum chuck for chucking a substrate.

15. The apparatus for transferring substrates in accordance with claim 13, wherein said plurality of holding plates slide into a backward opening part of said first carrier, to thereby move said plurality of substrates from a forward opening part of said first carrier into a forward opening part of said second carrier.

16. The apparatus for transferring substrates in accordance with claim 11, wherein said turning means comprises a turning stage for holding said second carrier, and said turning stage is operable to turn around a horizontal axis.

17. A method of processing substrates, comprising the steps of:

(a) placing a first carrier on a carrier stage, said first carrier holding a plurality of substrates in a horizontal attitude;

(b) transferring said plurality of substrates held in the horizontal attitude from said first carrier to a second carrier placed on a turning stage;

(c) turning said turning stage, to thereby turn said plurality of substrates from the horizontal attitude to a vertical attitude;

(d) transporting said plurality of substrates held in the vertical attitude from said second carrier to processing means; and (e) processing said plurality of substrates held in the vertical attitude.

18. The method of processing substrates in accordance with claim 17, wherein said step (d) comprises the steps of:

(d-1) transporting said second carrier from said turning stage to a predetermined place;

(d-2) taking out said plurality of substrates from said second carrier placed in said predetermined place; and (d-3) transporting said plurality of substrates to said processing means.

19. The method of processing substrates in accordance with claim 17, wherein said step (d) comprises the steps of:

(d-1) taking out said plurality of substrates from said second carrier placed on said turning stage; and (d-2) transporting said plurality of substrates to said processing means.

20. The method of processing substrates in accordance with claim 17, wherein said step (d) comprises the steps of:

(d-1) transporting said plurality of substrates from said second carrier to a third carrier; and (d-2) transporting said third carrier to said processing means.

* * * * *